US009503053B1

United States Patent
Kim et al.

(10) Patent No.: US 9,503,053 B1
(45) Date of Patent: Nov. 22, 2016

(54) ACTIVE BALUN FOR WIDEBAND APPLICATIONS

(71) Applicant: QUALCOMM Incorporated, San Diego, CA (US)

(72) Inventors: Sunyoung Kim, Santa Clara, CA (US); Cheng-Han Wang, San Jose, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/711,493

(22) Filed: May 13, 2015

(51) Int. Cl.
*H03F 3/45* (2006.01)
*H03H 11/32* (2006.01)
*H03F 3/193* (2006.01)

(52) U.S. Cl.
CPC .............. *H03H 11/32* (2013.01); *H03F 3/193* (2013.01); *H03F 2200/451* (2013.01)

(58) Field of Classification Search
CPC ... H03F 2200/06; H03F 2200/09; H03F 3/45
USPC .............................. 330/258, 259, 301; 333/25
See application file for complete search history.

(56) References Cited

U.S. PATENT DOCUMENTS

| 6,366,171 | B1 * | 4/2002 | Litmanen | H03F 1/22 330/301 |
| 6,549,971 | B1 * | 4/2003 | Cecchi | H04L 25/0292 327/55 |
| 7,538,618 | B2 | 5/2009 | Park et al. | |
| 7,737,789 | B2 | 6/2010 | Eisenstadt et al. | |
| 8,031,004 | B2 | 10/2011 | Jeong et al. | |
| 8,421,541 | B2 | 4/2013 | Sengupta et al. | |
| 2014/0218114 | A1 | 8/2014 | Rossi | |
| 2014/0266469 | A1 | 9/2014 | Issakov | |
| 2014/0361834 | A1 | 12/2014 | Fritz et al. | |

OTHER PUBLICATIONS

Blaakmeer S.C., et al., "Wideband Balun-LNA With Simultaneous Output Balancing, Noise-Canceling and Distortion-Canceling" IEEE Journal of Solid-State Circuits, IEEE Service Center, Piscataway, NJ, US, vol. 43, No. 6, Jun. 1, 2008 (Jun. 1, 2008), pp. 1341-1350, XP011215762 ISSN: 0018-9200.
Bruccoleri F., et al., "Wide-Band CMOS Low-Noise Amplifier Exploiting Thermal Noise Canceling", IEEE Journal of Solid-State Circuits, IEEE Service Center, Piscataway, NJ, USA, vol. 39, No. 2, Feb. 1, 2004 (Feb. 1, 2004), pp. 275-282, XP011106496, ISSN: 0018-9200, DOI: DOL10.1109/JSSC.2003.821786.

* cited by examiner

*Primary Examiner* — Steven J Mottola
(74) *Attorney, Agent, or Firm* — Procopio, Cory, Hargreaves & Savitch LLP

(57) ABSTRACT

An active balun uses two inverters to produce a differential output from a single-ended input. A current source supplies current to both inverters and a current sink sinks current from both inverters. The inverters include bias resistors coupled between their inputs and outputs. A coupling capacitor couples the output of the first inverter to the input of the first inverter. Values of the bias resistors and the coupling capacitor may selected to assure stability of the active balun. The values may be programmable, for example, based on a desired operating frequency. The current source may be biased by a common-mode feedback circuit based on the common-mode voltage of the differential output.

23 Claims, 2 Drawing Sheets

ACTIVE BALUN FOR WIDEBAND APPLICATIONS

BACKGROUND

Field

The present disclosure relates to electronic circuits and, more particularly, to active baluns for wideband applications.

Background

A balun converts between single-ended and differential signals. Baluns are commonly used with radio frequency (RF) signals in wireless communication systems. In wireless communication devices, many antennas use single-ended signals and many circuits use differential signals with baluns converting between the single-ended and differential signals.

Some prior active baluns, for example, baluns using a common-gate common-source architecture, may have poor performance with their output signals not being truly differential in phase or in amplitude. Additionally, these prior active baluns may not function at high frequencies (e.g., 5 GHz) due, for example, to sensitivity to parasitic components. Other prior active baluns, for example, using a differential amplifier architecture, may require a mismatch compensation circuit which increases power and circuit area. Additionally, these prior active baluns may suffer from instability issues.

SUMMARY

In one aspect, an active balun for receiving a single-ended input and producing a differential output including a non-inverted output and an inverted output is provided. The active balun includes: a current source; a current sink; a first inverter coupled between an output of the current source and an output of the current sink and having an input coupled to the input of the active balun and an output coupled to the inverted output of the active balun; and a second inverter coupled between an output of the current source and an output of the current sink and having an input coupled to the output of the first inverter and an output coupled to the non-inverted output of the active balun.

In one aspect, a method for receiving a single-ended input signal and producing a differential output signal including a non-inverted output signal and an inverted output signal is provided. The method includes: sourcing current to a first common node; sinking current from a second common node; inverting the input signal to produce the inverted output signal using the current sourced to the first common node and the current sunk from the second common node; and inverting the inverted output signal to produce the non-inverted output signal using the current sourced to the first common node and the current sunk from the second common node.

In one aspect, an active balun for receiving a single-ended input and producing a differential output including a non-inverted output and an inverted output is provided. The active balun includes: a means for sourcing current to a first common node; a means for sinking current from a second common node; a means for inverting the input of the active balun to produce the inverted output of the active balun, the means coupled between the first common node and the second common node; and a means for inverting the inverted output of the active balun to produce the non-inverted output of the active balun, the means coupled between the first common node and the second common node.

Other features and advantages of the present disclosure should be apparent from the following description which illustrates, by way of example, aspects of the disclosure.

BRIEF DESCRIPTION OF THE DRAWINGS

The details of the present disclosure, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
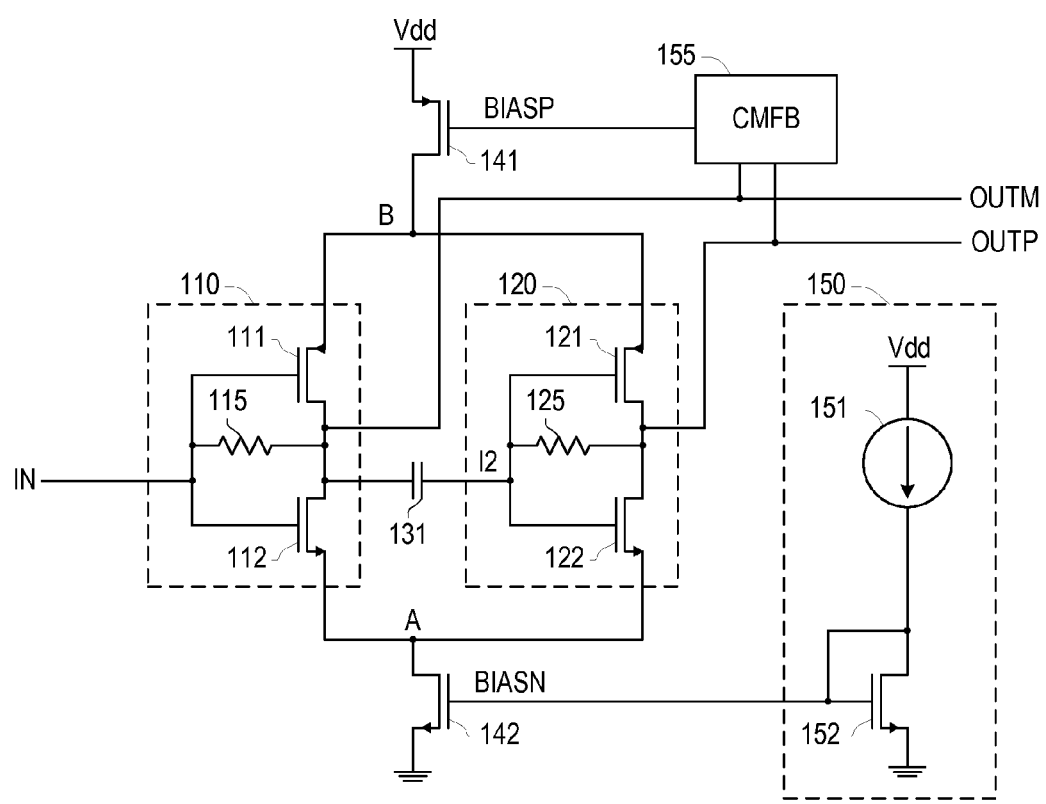
FIG. 1 is a schematic diagram of an active balun according to a presently disclosed embodiment.

FIG. 1 is a schematic diagram of an active balun according to a presently disclosed embodiment. The active balun produces a differential output (inverted output OUTM and non-inverted output OUTP) from a single-ended input IN. The active balun may be implemented, for example, in a complementary metal-oxide semiconductor (CMOS) process.

The active balun includes a first inverter 110 and a second inverter 120. The first inverter 110 has an input coupled to the single ended input of the balun and an output coupled to the inverted output of the balun. The second inverter 120 has an input coupled to the output of the first inverter 110 and an output coupled to the non-inverted output of the balun. The input of the second inverter 120 is coupled to the output of the first inverter 110 via a coupling capacitor 131. The input of the balun may also be capacitively coupled to the source of the input.

A current source 141 sources current to the first inverter 110 and the second inverter 120 via node B. Although a single-transistor current source is shown in FIG. 1, other types of current sources may also be used. Since the current source 141 has a high output impedance, the sourced current will be nearly constant. Since the current source 141 sources current to both the first inverter 110 and the second inverter 120, the total current supplied to the inverted output and the non-inverted output will also be nearly constant with changes in the current to the inverted output being complementary (same amplitude but opposite polarity) to changes in the current to the non-inverted output. This aids matching between the inverted output and non-inverted output. Additionally, use of high-impedance current sources may increase the voltage headroom on the output which can aid in achieving high linearity.

A current sink 142 sinks current from the first inverter 110 and the second inverter 120 via node A. Although a single-transistor current sink is shown in FIG. 1, other types of current sources may also be used. The current sink 142 operates in a similar manner as the current source 141. Node A and node B may be referred to as common nodes due, for example, to their common connections to the first inverter 110 and the second inverter 120.

A bias circuit 150 control the current sunk by the current sink 142. The bias circuit 150 includes a bias current source 151 that supplies a reference current. The amount of current sourced by the bias current source 151 may be selected based, for example, on a desired performance of the active balun. The reference current may be set from other components used with the active balun. In the embodiment of FIG. 1, the bias circuit 150 includes a bias n-channel transistor 152 that sinks the reference current from the bias current source 151. The bias n-channel transistor 152 has its gate connected to its drain (node BIASN) and connected to the output of the bias current source 151. The source of bias n-channel transistor 152 connects to a ground reference. The gate of bias n-channel transistor 152 connects to the gate of the n-channel transistor in the current sink 142. Thus, the bias n-channel transistor 152 and the n-channel transistor in the current sink 142 form a current mirror. When other current sink circuits are used, the bias circuit 150 may be modified accordingly.

A common-mode feedback (CMFB) circuit 155 biases the current source 141. The CMFB circuit 155 receives the inverted output and the non-inverted output, determines the common-mode level, compares the common mode level to a desired level (e.g., one half the supply voltage), and adjusts the bias of the current source 141 to adjust the common mode level to the desired level. In an alternative embodiment, a common-mode feedback circuit controls the current sink 142 and a bias circuit controls the current source 141. In the embodiment of FIG. 1, the CMFB circuit 155 controls the voltage on the gate (node BIASP) of the p-channel transistor in the current source 141. When other current source circuits are used, the CMFB circuit 155 may be modified accordingly.

The first inverter 110 includes a first p-channel transistor 111, a first n-channel transistor 112, and a first bias resistor 115. The first p-channel transistor 111 has a source connected to the output of the current source 141, a gate connected to the input of the balun, and a drain connected to the inverted output of the balun. The first re-channel transistor 112 has a source connected to the output of the current sink 142, a gate connected to the input of the balun, and a drain connected to the inverted output of the balun. The first bias resistor 115 has a first terminal connected to the input of the first inverter 110 and a second terminal connected to the output of the first inverter 110. The first bias resistor 115 provides negative feedback between the input and the output of the first inverter 110 to aid stability of the balun.

The gain of the first inverter 110 is determined by the transconductance of the first p-channel transistor 111 and the first n-channel transistor 112 and the equivalent load impedance on the output. The equivalent load impedance includes the impedance of the load (e.g., the input impedance of the mixer module 230 in the receiver chain of FIG. 2) and the effect of the first bias resistor 115. The gain depends (in a simplified but practical analysis) on the product of the transistor transconductances and the equivalent load impedance. Since the equivalent load impedance depends on the resistance of the first bias resistor 115, the gain of the first inverter 110 can be adjusted by changing the resistance of the first bias resistor 115. For example, the resistance of the first bias resistor 115 may be chosen so that the magnitude of the gain of the first inverter 110 is less than one, thereby assuring stability.

The load impedance presented by some circuits driven by the balun may be based on transistor output impedances, which vary inversely with transconductance. In such cases, parametric variations in the gain (based on the transconductance-equivalent load impedance product) are reduced. This can aid in achieving high frequency operation.

The second inverter 120 includes a second p-channel transistor 121, a second n-channel transistor 122, and a second bias resistor 125 and is arranged in a similar manner as the first inverter 110. The coupling capacitor 131 between the output of the first inverter 110 and the input of the second inverter 120 in combination with the input impedance of the second inverter 120 (e.g., based on the second bias resistor 125 and the load impedance) provides high-pass filtering. This can further avoid instability of the balun by preventing a latch-up condition. The capacitance of the coupling capacitor 131 may be programmable, for example, based on the load impedance or operating frequency.

The first inverter 110 and the second inverter 120 illustrated in FIG. 1 may be referred to as push-pull amplifiers. Other inverter circuits may also be used. For example, inverters where the inputs drive n-channel transistors with resistive loads (e.g., using resistors or biased-transistors) may be used. Similarly, inverters with inputs driving p-channel transistors may be used. The first bias resistor 115 and the second bias resistor 125 may be implemented using, for example, polysilicon resistors, metal resistors, n-channel transistors, p-channel transistors, n-channel transistors and p-channel transistors, or other resistive circuits.

In various embodiments, the resistances of the first bias resistor 115 and the second bias resistor 125 and the capacitance of the coupling capacitor 131 are fixed or programmable in various combinations. The values of resistance and capacitance may be set, for example, based on operating frequency or process conditions. In an embodiment, for example, for a narrow band application, the first bias resistor 115, the second bias resistor 125, and the coupling capacitor 131 may all be fixed. Since the gain of the second inverter 120 may not be critical to performance of the balun, in another embodiment, the first bias resistor 115 and the coupling capacitor 131 are programmable and the second bias resistor 125 is fixed. The programmable resistors and capacitors may be implemented using parallel elements coupled in series with switches. The switches may be controlled, for example, from a control register.

Figure 2:
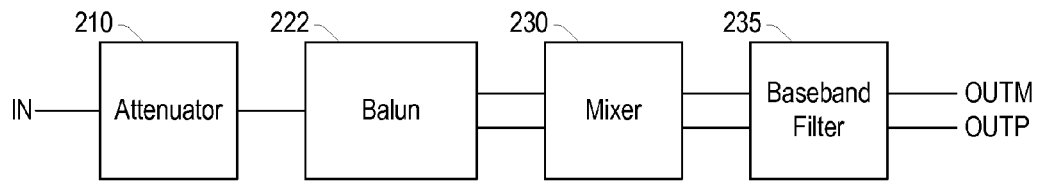
FIG. 2 is a block diagram of an example receiver chain using the active balun of FIG. 1.

FIG. 2 is a block diagram of an example receiver chain using the active balun of FIG. 1. The active balun of FIG. 1 may also be used in other systems. The receiver chain of FIG. 2 may be used in a wireless communication device. The receiver chain may be used, for example, in a mobile phone or a base station, such as a small-cell base station.

An attenuator module 210 receives an input signal IN and produces an attenuated output signal. The input signal may be from an antenna. The input signal and the output signal are single-ended signals. The attenuator module 210 may be adjustable to compensate for varying input signal levels. The attenuator module 210 may be implemented, for example, using a resistor pi network. In some applications, the attenuator module 210 may be omitted or can be bypassed.

A balun 222 receives the output signal from the attenuator module 210 and converts the received single-ended signal to a differential signal. Prior systems have used passive baluns implemented using inductors and capacitors (e.g., LC-CL networks). Passive baluns may be expensive and large. The performance of systems using passive baluns may be poor due to magnetic coupling between components. Additionally, passive baluns function over a narrow frequency range. Thus, in a wideband system, multiple baluns may be required to cover the range of frequencies used. Other prior systems have used active baluns. Some prior active baluns suffer from poor performance. Some prior active baluns also function over only a narrow frequency range and may not operate at high frequencies, such as 5 GHz. The active balun of FIG. 1 may be used to implement the balun 222 and alleviate or eliminate one or more of the shortcomings of prior systems.

In the example receiver chain of FIG. 2, a mixer module 230 receives the differential output signal of the balun 222 and down-converts the received signal to a baseband representation. The baseband signal output of the mixer is also a differential signal. A baseband filter module 235 receives the baseband signal from the mixer module 230 and filters the received signal, for example, to remove images from the down-conversion. The baseband filter module 235 produces a differential output signal (OUTM, OUTP) of the receiver chain.

Figure 3:
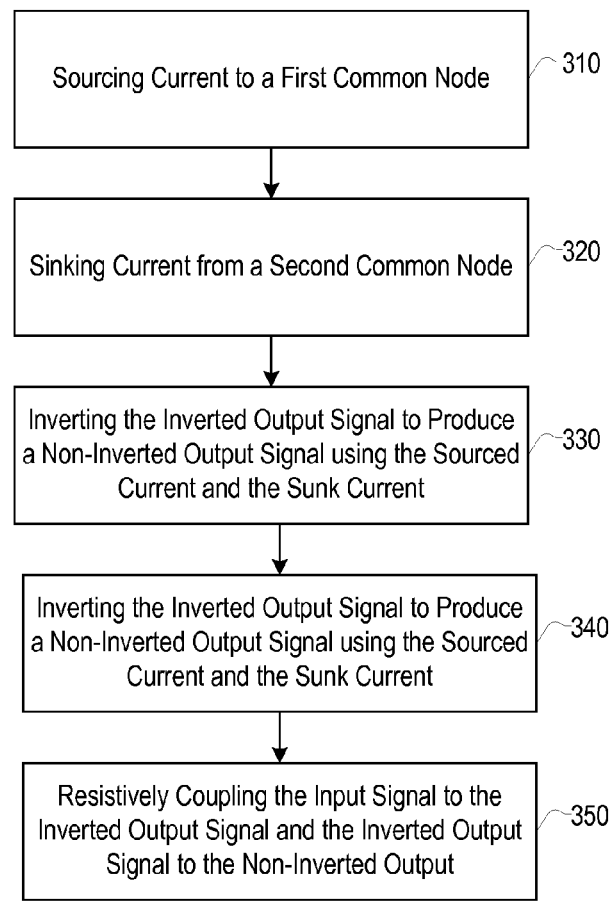
FIG. 3 is a flowchart of a process for converting a single-ended signal to a differential signal according to a presently disclosed embodiment.

FIG. 3 is a flowchart of a process for converting a single-ended signal to a differential signal according to a presently disclosed embodiment. The process of FIG. 3 may be performed with any suitable circuit; however, to provide a specific example, the process will be described with reference to the active balun of FIG. 1. The process of FIG. 3 receives a single-ended input signal and produces a differential output signal including an inverted output signal and non-inverted output signal.

In block 310, the process sources current to a first common node. For example, the current source 141 may source current to node B. In block 320, the process sinks current from a second common node. For example, the current sink 142 may sink current from node A.

In block 330, the process inverts the input signal to produce the inverted output signal. The inversion uses the current sourced to the first common node and the current sunk from the second common node. For example, the first inverter 110 inverts the single-ended input to produce the inverted output. The first inverter 110 uses current from the current source 141 to pull the inverted output high. The first inverter 110 uses current sunk by the current sink 142 to pull the inverted output low.

In block 340, the process inverts the inverted output signal to produce the non-inverted output signal. The inversion uses the current sourced to the first common node and the current sunk from the second common node. For example, the second inverter 120 inverts the inverted output (via coupling capacitor 131) to produce the non-inverted output. The second inverter 120 uses current from the current source 141 to pull the non-inverted output high and uses current sunk by the current sink 142 to pull the non-inverted output low.

In block 350, the process resistively couples the input signal to the inverted output signal. For example, the first bias resistor 115 provides negative feedback from the inverted output to the input. In block 350, the process also resistively couples inverted output signal to the non-inverted output. For example, the second bias resistor 125 provides negative feedback from the non-inverted output to the inverted output (via coupling capacitor 131).

The process of FIG. 3 may be modified, for example, by adding or altering blocks. Additionally, the blocks may be performed concurrently.

Although particular embodiments are described above, many variations of the disclosure are possible, including, for example, those with different transistor types, with different biasing arrangements, or with additional amplification stages. Additionally embodiments have been described for CMOS technology but similar circuits may be used with other technologies. Additionally, features of the various embodiments may be combined in combinations that differ from those described above.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. An active balun for receiving a single-ended input and producing a differential output including a non-inverted output and an inverted output, the active balun comprising:
 a current source having an output coupled to a first common node;
 a current sink having an output coupled to a second common node;
 a first inverter coupled between the first common node and the second common node and having an input coupled to the input of the active balun and an output coupled to the inverted output of the active balun; and
 a second inverter coupled between the first common node and the second common node and having an input coupled to the output of the first inverter and an output coupled to the non-inverted output of the active balun.

2. The active balun of claim 1, wherein the first inverter includes a first bias resistor coupled between the input and the output of the first inverter and the second inverter includes a second bias resistor coupled between the input and the output of the second inverter.

3. The active balun of claim 2, further comprising a coupling capacitor having a first terminal coupled to the input of the second inverter and a second terminal coupled to the output of the first inverter.

4. The active balun of claim 3, wherein values of the first bias resistor, the second bias resistor, and the coupling capacitor are selected to assure stability of the active balun.

5. The active balun of claim 2, wherein the first bias resistor is a programmable resistor configured to control a gain of the first inverter.

6. The active balun of claim 2, wherein a value of the first bias resistor is selected to set a magnitude of a gain of the first inverter to be less than one.

7. The active balun of claim 1, further comprising a bias circuit configured to bias an amount of current sunk by the current sink.

8. The active balun of claim 1, further comprising a common-mode feedback circuit configured to bias an amount of current sourced by the current source based on a common-mode level of the differential output.

9. The active balun of claim 1, wherein the first inverter includes:
  a first p-channel transistor having a source coupled to the first common node, a gate coupled to the input of the active balun, and a drain coupled to the inverted output of the active balun; and
  a first n-channel transistor having a source coupled to the second common node, a gate coupled to the input of the active balun, and a drain coupled to the inverted output of the active balun, and
wherein the second inverter includes:
  a second p-channel transistor having a source coupled to the first common node, a gate coupled to the output of the first inverter, and a drain coupled to the non-inverted output of the active balun; and
  a second n-channel transistor having a source coupled to the second common node, a gate coupled to the output of the first inverter, and a drain coupled to the non-inverted output of the active balun.

10. A method for receiving a single-ended input signal and producing a differential output signal including a non-inverted output signal and an inverted output signal, the method comprising:
  sourcing current to a first common node;
  sinking current from a second common node;
  inverting the input signal to produce the inverted output signal using the current sourced to the first common node and the current sunk from the second common node; and
  inverting the inverted output signal to produce the non-inverted output signal using the current sourced to the first common node and the current sunk from the second common node.

11. The method of claim 10, further comprising: resistively coupling the input signal to the inverted output signal; and resistively coupling the inverted output signal to the non-inverted output signal.

12. The method of claim 11, wherein inverting the inverted output signal to produce the non-inverted output signal uses capacitive coupling of the inverted output signal.

13. The method of claim 12, wherein values of the resistive coupling of the input signal to the inverted output signal, the resistive coupling of the inverted output signal to the non-inverted output signal, and the capacitive coupling of the inverted output signal are selected to assure stability of the method.

14. The method of claim 11, wherein a value of the resistive coupling of the input signal to the inverted output signal is selected to set a magnitude of a gain of inverting the input signal to produce the inverted output signal to be less than one.

15. The method of claim 10, wherein an amount of current sourced to the first common node is controlled based on a common-mode level of the differential output signal.

16. An active balun for receiving a single-ended input and producing a differential output including a non-inverted output and an inverted output, the active balun comprising:
  a means for sourcing current to a first common node;
  a means for sinking current from a second common node;
  a means for inverting the input of the active balun to produce the inverted output of the active balun, the means coupled between the first common node and the second common node; and
  a means for inverting the inverted output of the active balun to produce the non-inverted output of the active balun, the means coupled between the first common node and the second common node.

17. The active balun of claim 16, wherein the means for inverting the input of the active balun to produce the inverted output of the active balun includes a first bias resistor coupled between the input of the active balun and the inverted output of the active balun, and the means for inverting the inverted output of the active balun to produce the non-inverted output of the active balun includes a second bias resistor coupled between the inverted output of the active balun and the non-inverted output of the active balun.

18. The active balun of claim 17, further comprising a coupling capacitor having a first terminal coupled to an input of the means for inverting the inverted output of the active balun to produce the non-inverted output of the active balun and a second terminal coupled to the inverted output of the active balun.

19. The active balun of claim 18, wherein values of the first bias resistor, the second bias resistor, and the coupling capacitor are selected to assure stability of the active balun.

20. The active balun of claim 17, wherein the first bias resistor is a programmable resistor configured to control a gain of the means for inverting the input of the active balun to produce the inverted output of the active balun.

21. The active balun of claim 17, wherein a value of the first bias resistor is selected to set a magnitude of a gain of the means for inverting the input of the active balun to produce the inverted output of the active balun to be less than one.

22. The active balun of claim 16, further comprising a means for biasing a current sunk by the means for sinking current.

23. The active balun of claim 16, further comprising a common-mode feedback means for biasing a current sourced by the means for sourcing current based on a common-mode level of the differential output.

* * * * *